(12) United States Patent
Hutton

(10) Patent No.: US 8,860,458 B2
(45) Date of Patent: Oct. 14, 2014

(54) INTEGRATED CIRCUITS WITH LOGIC REGIONS HAVING INPUT AND OUTPUT BYPASS PATHS FOR ACCESSING REGISTERS

(75) Inventor: Michael D. Hutton, Mountain View, CA (US)

(73) Assignee: Altera Corporation, San Jose, CA (US)

( * ) Notice: Subject to any disclaimer, the term of this patent is extended or adjusted under 35 U.S.C. 154(b) by 161 days.

(21) Appl. No.: 13/555,014

(22) Filed: Jul. 20, 2012

(65) Prior Publication Data

US 2014/0021981 A1    Jan. 23, 2014

(51) Int. Cl.
*H03K 19/173* (2006.01)

(52) U.S. Cl.
USPC ............... 326/41; 326/38; 326/39; 326/40; 326/101

(58) Field of Classification Search
CPC ............... H03K 19/17736; H03K 19/1737; H03K 19/17728; H03K 19/1736; H03K 19/17704; H03K 19/17748; G06F 15/7867; G06F 7/53
USPC .............................. 326/38–41, 47, 101
See application file for complete search history.

(56) References Cited

U.S. PATENT DOCUMENTS

| | | |
|---|---|---|
| 6,407,576 B1 | 6/2002 | Ngai et al. |
| 6,429,681 B1 | 8/2002 | Hutton |
| 7,218,133 B2 | 5/2007 | Lewis |
| 7,420,390 B1 | 9/2008 | Hutton et al. |
| 7,675,319 B2 | 3/2010 | Hutton |
| 7,705,628 B1 | 4/2010 | Hutton et al. |
| 7,827,433 B1 | 11/2010 | Hutton |
| 7,868,655 B2 | 1/2011 | Lewis |
| 8,519,740 B2 * | 8/2013 | Hutton et al. ............... 326/38 |
| 8,542,032 B1 * | 9/2013 | Hutton et al. ............... 326/38 |
| 8,581,624 B2 * | 11/2013 | Cashman et al. ............. 326/38 |
| 8,704,548 B1 * | 4/2014 | Hutton ......................... 326/41 |

OTHER PUBLICATIONS

Singh et al. "The case for registered routing switches in Field Programmable Gate Arrays", FPGA Symposium, Feb. 2001. [Retrieved on Jul. 20, 2012]. Retrieved from the Internet: http://www.eecg.toronto.edu/~brown/papers/fpga01-singh.html.

Sharma et.al. "Exploration of Pipelined FPGA Interconnect Structures", FPGA Symposium, Feb. 2006. [Retrieved on Jul. 20, 2012]. Retrieved from the Internet: www.ece.wisc.edu/~kati/publications/sharmaFPGA04.pdf.

Eguro et.al., "Armada: timing-driven pipeline-aware routing for FPGAs", FPGA Symposium, Feb. 2006. [Retrieved on Jul. 20, 2012]. Retrieved from the Internet: http://dl.acm.org/citation.cfm?id=1117201.1117227.

* cited by examiner

*Primary Examiner* — Vibol Tan
(74) *Attorney, Agent, or Firm* — Treyz Law Group; Jason Tsai

(57) ABSTRACT

Integrated circuits such as programmable integrated circuits may include programmable logic regions that can be configured to perform custom functions. Interconnects may be used to route signals throughout the integrated circuit. The programmable logic regions may have input selection circuitry for selecting and providing input signals from the interconnects to the programmable logic regions. The programmable logic regions may include look-up table circuitry for processing the input signals and registers for storing output signals from the look-up table circuitry. The programmable logic regions may include output selection circuitry for selecting which output signals are provided to output circuitry of the programmable logic regions. The programmable logic regions may include bypass paths that provide direct access to the registers from the interconnects by bypassing the input and output selection circuitry. Computer-aided design tools may be used to identify registers in a design that should be used for register pipelining.

20 Claims, 10 Drawing Sheets

INTEGRATED CIRCUITS WITH LOGIC REGIONS HAVING INPUT AND OUTPUT BYPASS PATHS FOR ACCESSING REGISTERS

BACKGROUND

This relates to integrated circuits such as programmable integrated circuits with interconnect circuitry.

Programmable integrated circuits are well known. Programmable integrated circuits can be programmed by a user to implement a desired custom logic function. In a typical scenario, a logic designer uses computer-aided design (CAD) tools to design a custom logic circuit. When the design process is complete, the tools generate configuration data. The configuration data is loaded into programmable integrated circuit memory elements to configure the device to perform the functions of the custom logic circuit. In particular, the configuration data configures programmable interconnects, programmable routing circuits, and programmable logic circuits in the programmable integrated circuits.

Programmable integrated circuits include programmable logic circuits that are configured to receive input signals and perform custom functions to produce output signals. The input and output signals of each logic circuit are provided by interconnects that can be configured to route selected signals throughout the programmable integrated circuit.

Programmable integrated circuits often operate using clock signals that operate at clock frequencies. To accommodate increasing performance requirements of modern programmable integrated circuits, clock frequencies are often increased. The maximum clock frequency at which circuitry on a programmable integrated circuit can operate is inversely proportional to the maximum delay between any two registers that share a clock signal (sometimes referred to as the critical path delay). If the maximum delay is decreased, the clock frequency can be increased, which tends to improve system performance.

Interconnect delay contributes to the critical path delay between registers. The signal delay associated with a given interconnect is proportional to the length of the interconnect. In order to reduce the maximum delay between first and second registers, circuit designers often route signals through additional registers of programmable logic circuits that are interposed between the first and second registers (e.g., to reduce the length of interconnects traversed by a signal from the output of any given register to the input of a subsequent register). The technique of routing signals through additional registers to reduce critical path length may sometimes be referred to as pipelining or register pipelining. Registers used for pipelining are sometimes referred to as pipeline registers.

Using registers of conventional programmable logic circuits for pipelining introduces additional delay that reduces the performance benefits provided by pipelining. For example, conventional programmable logic circuits have input multiplexers and look-up table circuitry through which signals are routed to reach programmable logic circuits for processing. The input multiplexers are coupled to many interconnects (e.g., tens or hundreds or more). In this scenario, it may be time consuming for the input multiplexers to select a signal from a single interconnect to route through the look-up table circuitry to the registers. The signal also occupies an input terminal of the programmable logic circuits, which reduces the number of available input terminals of the programmable logic circuits that can be used to perform custom user functions.

SUMMARY

An integrated circuit such as a programmable integrated circuit may include logic regions (e.g., programmable logic regions). A programmable integrated circuit may include global interconnects that are used to route signals throughout the integrated circuit. Each logic region may include input selection circuitry that is coupled to a corresponding set of interconnects. The input selection circuitry may be configured to provide selected signals from the set of interconnects to inputs of the corresponding logic region. The logic region may be configured to perform custom functions to produce output signals from the selected signals. For example, the logic region may include look-up table circuitry that receives the selected signals and is configured to produce the output signals.

A logic region may include one or more registers. The registers may be used to store information such as output signals produced by look-up table circuitry of the logic region. The logic region may include output selection circuitry that receives each of the output signals stored by the registers. The output selection circuitry may be configured to select output signals from the registers and provide the selected output signals to output circuitry. The output circuitry may be used to drive interconnects (e.g., global interconnects). For example, the output circuitry may include a multiplexer and a driver coupled to each interconnect.

Logic regions may include bypass paths for directly accessing registers (e.g., to bypass input selection circuitry, output selection circuitry, and look-up table circuitry). The bypass paths may include input bypass paths having input bypass circuitry for bypassing input selection circuitry. The bypass paths may include output bypass paths that couple register outputs directly to output circuitry (e.g., bypassing output selection circuitry). As an example, each multiplexer of the output circuitry that is directly coupled to a corresponding driver and interconnect may have inputs that receive signals from the register outputs, signals from output selection circuitry, and signals from additional interconnects. In this scenario, signals from register outputs may be provided directly to the multiplexer of the output circuitry and driven onto the corresponding interconnect as an interconnect signal.

Computing equipment may be used to configure registers of programmable integrated circuits for register pipelining. The computing equipment may sometimes be referred to as a logic design system. The computing equipment may include computer-aided design tools that can be used to generate configuration data based on functional descriptions of a design (e.g., custom function information provided by a user). The computer-aided design tools may be used to synthesize a netlist from the functional descriptions of the design (e.g., a list of circuits and logical connections between the circuits that collectively serve to perform desired functions).

The computer-aided design tools may subsequently analyze the synthesized netlist to identify registers of the netlist that are intended to be pipeline registers (e.g., registers that are associated with pipelining). For example, registers that are logically coupled in series in the synthesized netlist may be identified. As another example, registers in the synthesized netlist that receive the same clock signal may be identified. As yet another example, custom function information provided by a user may also be analyzed to determine whether registers have already been identified (e.g., tagged by a user such as through the use of a synthesis attribute or pragma) as being associated with register pipelining.

If desired, the computer-aided design tools may be used to identify paths in the synthesized netlist between signal sources (e.g., source circuits) and signal destinations (e.g., destination circuits) that fail timing constraints. For example, the computer-aided design tools may assign the signal sources and signal destinations to logic regions. In this scenario, the computer-aided design tools may estimate routing delays corresponding to distances between the logic regions. In response to determining that the routing delays exceed thresholds associated with timing constraints, the computer-aided design tools may modify paths between the signal sources and the signal destinations to include pipeline registers.

Further features of the invention, its nature and various advantages will be more apparent from the accompanying drawings and the following detailed description of the preferred embodiments.

DETAILED DESCRIPTION

The present invention relates to programmable integrated circuits. The programmable integrated circuits may include programmable logic, programmable interconnects, and programmable routing circuitry.

Figure 1A:
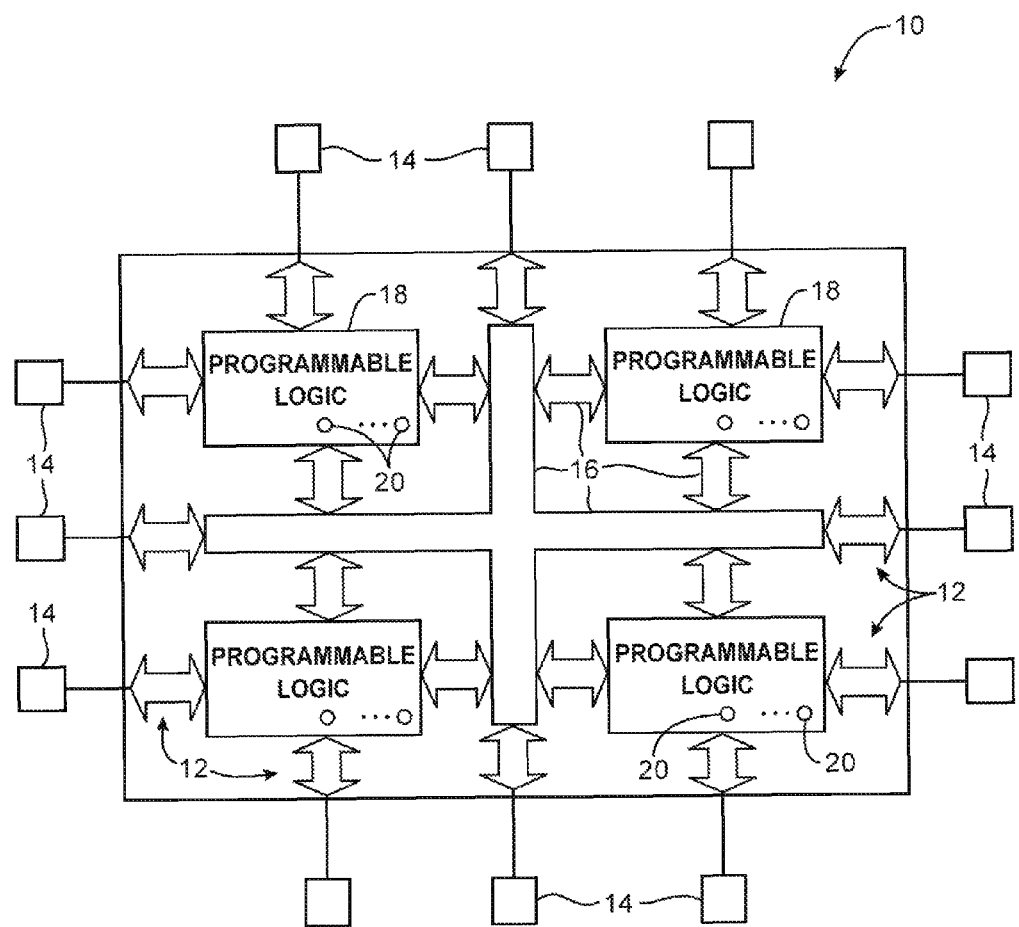
FIG. 1A is an illustrative diagram of a programmable integrated circuit with programmable logic in accordance with an embodiment of the present invention.

FIG. 1A shows a diagram of an illustrative programmable integrated circuit device. As shown in FIG. 1A, device 10 may have input-output (I/O) circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Interconnection resources 16 may sometimes be referred to herein as interconnects (e.g., interconnects formed from combinations of fixed interconnects and programmable interconnects).

Interconnects 16 may be used to interconnect regions of programmable logic such as programmable logic regions 18. Programmable logic regions 18 may sometimes be referred to as logic array blocks or programmable circuit regions. Programmable logic regions 18, may, if desired, contain groups of smaller logic regions. These smaller logic regions, which may sometimes be referred to as logic elements or adaptive logic modules, may be interconnected using local interconnection resources.

Programmable logic regions 18 may include combinational and sequential logic circuitry. For example, programmable logic regions 18 may include look-up tables, registers, and multiplexers. Programmable logic regions 18 may be configured to perform a custom logic function.

Programmable logic regions 18 contain programmable elements 20. Programmable elements 20 may be based on any suitable programmable technology, such as fuses, antifuses, electrically-programmable read-only-memory technology, random-access memory cells, mask-programmed elements, etc. As an example, programmable elements 20 may be formed from memory cells. During programming, configuration data is loaded into the memory cells using pins 14 and input-output circuitry 12. The memory cells are typically random-access-memory (RAM) cells. Because the RAM cells are loaded with configuration data, they are sometimes referred to as configuration RAM cells (CRAM).

Programmable elements 20 may be used to provide static control output signals for controlling the state of logic components in programmable logic 18. The output signals generated by elements 20 are typically applied to gates of metal-oxide-semiconductor (MOS) transistors (sometimes referred to as pass gate transistors). In some scenarios, programmable elements 20 may be used to provide static data output signals for programmable circuitry. For example, look-up tables may include programmable elements 20 that produce static data output signals. In this scenario, the look-up tables may provide the static data output signals at look-up table outputs based on control signals provided to the look-up tables.

The circuitry of device 10 may be organized using any suitable architecture. As an example, logic 18 of programmable device 10 may be organized in a series of rows and columns of larger programmable logic regions, each of which contains multiple smaller logic regions. The logic resources of device 10 may be interconnected by interconnection resources 16 such as associated vertical and horizontal conductors. These conductors may include global conductive lines that span substantially all of device 10, fractional global lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Other device arrangements may use logic that is not arranged in rows and columns.

Figure 1B:
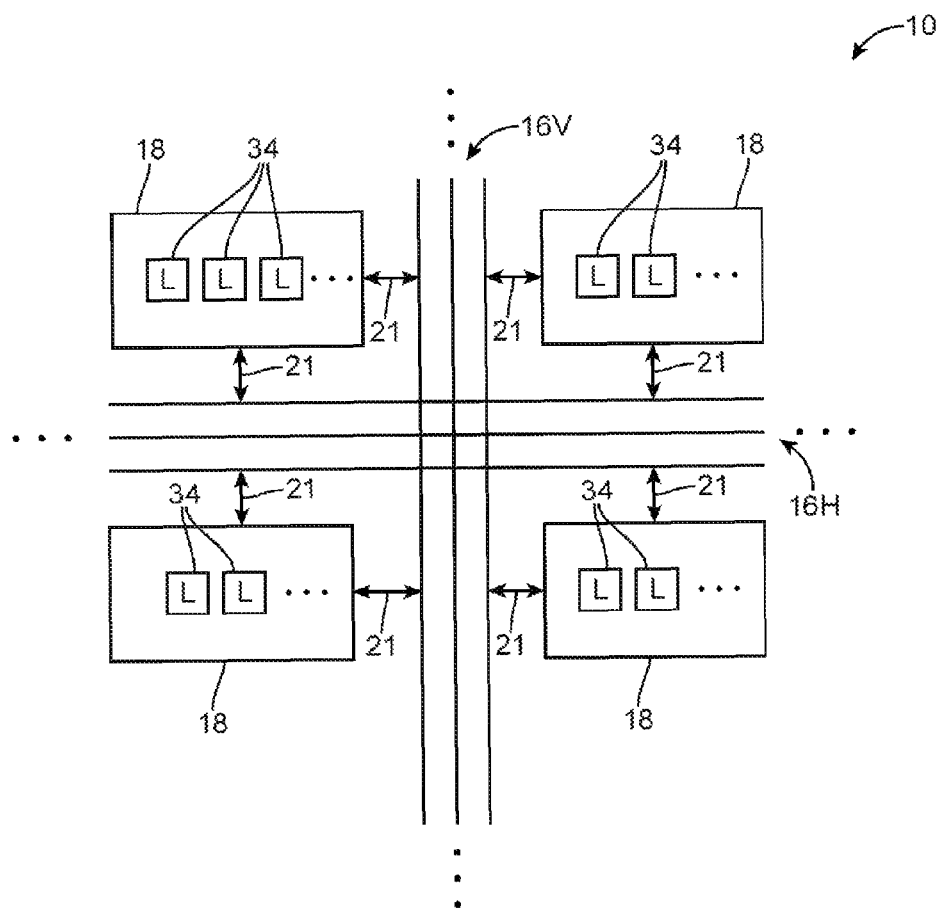
FIG. 1B is an illustrative diagram of programmable logic regions having input-output circuitry configured to drive interconnects in accordance with an embodiment of the present invention.

FIG. 1B is an illustrative diagram of programmable logic regions 18 in device 10 having input-output circuits 21 that can be configured to drive horizontal interconnects 16H (e.g., interconnects formed along a horizontal axis of device 10) and vertical interconnects 16V (e.g., interconnects formed along a vertical axis of device 10). Programmable logic regions 18 may include smaller programmable regions 34 (e.g., logic elements or adaptive logic modules) that receive input signals from interconnects 16V and 16H via input-output circuits 21 and perform custom functions on the input signals to produce output signals. The output signals produced by logic regions 34 may be provided to output circuits of input-output circuits 21. The output circuits may drive the output signals onto selected interconnects.

Input-output circuits 21 may include circuitry such as input selection circuitry for selecting input signals for programmable logic regions 18 from interconnects 16 and output selection circuitry for selecting which of interconnects 16 to provide with output signals from programmable logic regions 18. Input-output circuits 21 may include output circuits having drivers that are used to drive interconnects with output signals.

Figure 2:
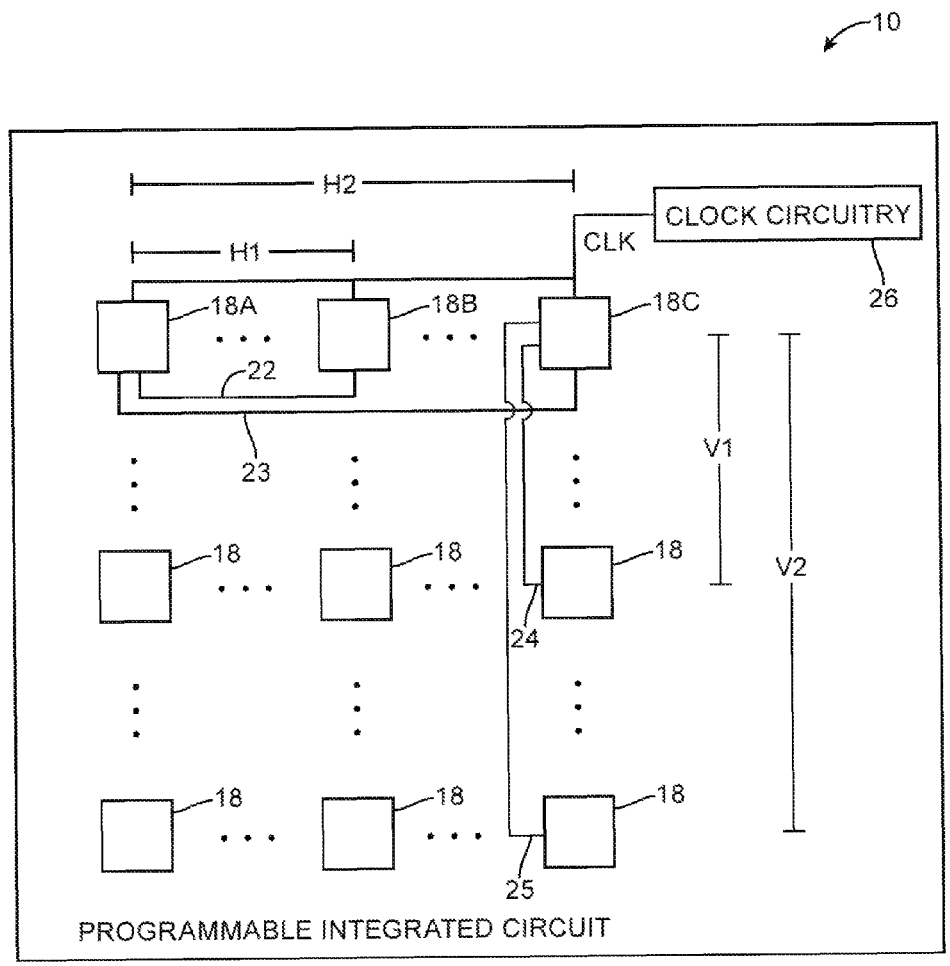
FIG. 2 is an illustrative diagram of interconnects on a programmable integrated circuit that are formed in horizontal and vertical directions with different lengths in accordance with an embodiment of the present invention.

FIG. 2 shows an illustrative arrangement in which programmable logic regions 18 are coupled via interconnects such as interconnects 22, 23, 24, and 25 (e.g., global interconnects that provide routing paths across integrated circuit 10). Interconnects 22, 23, 24, and 25 may be formed as part of interconnects 16 of FIG. 1. Interconnects 22 and 23 may be formed along a horizontal axis and may therefore be referred to as horizontal interconnects. Interconnects 24 and 25 may be formed along a vertical axis and may therefore be referred to as vertical interconnects.

As shown in FIG. 2, horizontal interconnects 22 and 23 and vertical interconnects 24 and 25 may be formed with varying lengths. Horizontal interconnects 22 and 23 may have respective lengths H1 and H2 and vertical interconnects 24 and 25 may have respective lengths V1 and V2. The horizontal and vertical interconnects may provide programmable logic regions 18 with routing paths throughout device 10 (e.g., to other programmable logic regions 18). Lengths H1, H2, V1, and V2 may vary depending on the distances between programmable logic regions 18 (e.g., length H1 may correspond to the distance between programmable logic regions 18A and 18B, whereas length H2 may correspond to the distance between programmable logic regions 18A and 18C). Each programmable logic region 18 may be independently configured to drive output signals onto the interconnects (e.g., using driver circuits within that programmable logic region 18).

Programmable integrated circuit 10 may include clock circuitry 26 that provides clock signals. The clock signals may be provided to programmable logic regions 18. For example, clock circuitry 26 may provide clock signal CLK to programmable logic regions 18A, 18B, and 18C. The frequency of clock signal CLK may control the processing speed at which programmable logic regions 18A, 18B, and 18C operate (e.g., registers in the programmable logic regions may be updated every clock cycle of clock signal CLK).

In some scenarios, it may be desirable to route output signals from a first programmable logic region to inputs of a second programmable logic region through a third intervening programmable logic region. Consider the scenario in which programmable logic region 18A produces an output signal that is to be routed to programmable logic region 18C. However, interconnect 23 that couples region 18A to region 18C may have an associated signal delay that exceeds the maximum acceptable delay for the clock frequency of clock signal CLK (e.g., the time required for the output signal to arrive at region 18B from region 18A may exceed the clock period of the clock frequency). In this scenario, it may be desirable to pipeline the output signals from region 18A by routing the output signal to region 18C through a register of intervening region 18B (e.g., because interconnect paths between region 18A and 18B and between region 18B and 18C may be sufficiently short to satisfy timing requirements).

Figure 3:
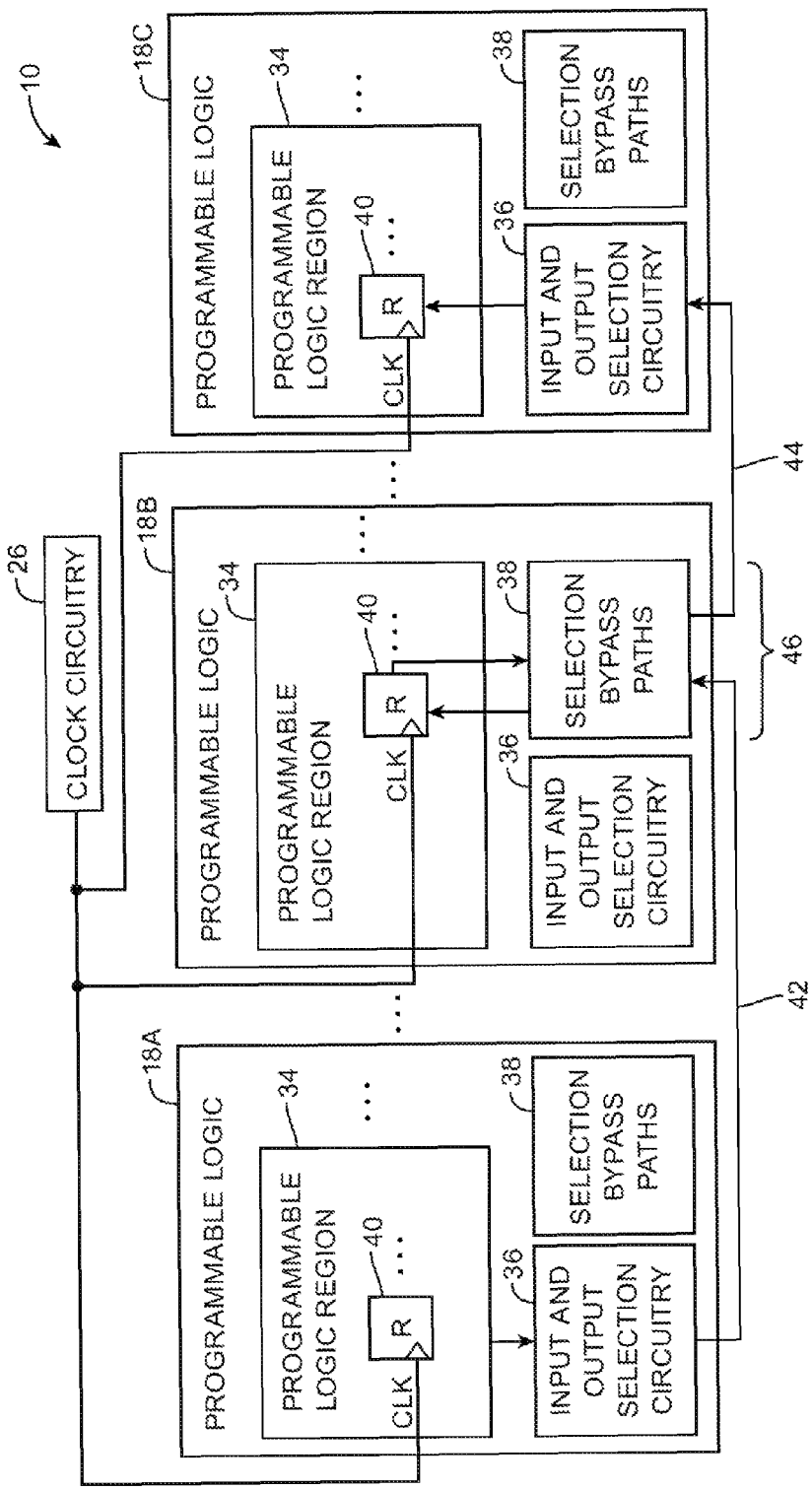
FIG. 3 is an illustrative diagram of programmable logic with input and output selection circuitry and selection bypass paths in accordance with an embodiment of the present invention.

Programmable logic regions may be provided with bypass paths for accommodating register pipelining using registers of the programmable logic regions. FIG. 3 is an illustrative diagram of programmable logic regions 18A, 18B, and 18C with bypass paths 38. Bypass paths 38 may sometimes be referred to as selection bypass paths, because they can be used to bypass input and/or output selection circuitry. Programmable logic regions 18A, 18B, and 18C may each include one or more smaller programmable logic regions 34 that can be configured to perform custom user functions (e.g., programmable logic elements or adaptive logic modules). As an example, programmable logic region 18A may include a single logic element 34, two logic elements 34, four logic elements 34, or more.

Programmable logic regions 18A, 18B, and 18C may each include input and output selection circuitry 36. Input and output selection circuitry 36 may be used to select which interconnects are coupled to programmable logic regions 34 (e.g., which of interconnects 16 of FIG. 2). For example, circuitry 36 may include input selection circuitry for selecting which interconnects are used to provide input signals to programmable logic regions 34. Programmable logic regions 34 may receive the input signals and perform custom user functions to produce output signals. Circuitry 36 may include output selection circuitry for selecting which interconnects are used to route the output signals from programmable logic regions 34 to other regions of integrated circuit 10. Input and output selection circuitry 36 may include circuitry such as multiplexers that can be configured via corresponding programmable elements (not shown). Input and output selection circuitry 36 may be formed as part of input-output circuits such as input-output circuits 21 of FIG. 1A.

Programmable logic regions 34 may each include one or more registers 40 that can be used to store data. For example, registers 40 may be used to store output data generated by the programmable logic regions. In this scenario, the output data stored in registers 40 may be routed throughout programmable integrated circuit 10 using interconnects such as interconnects 42 and 44. Registers 40 may receive clock signal CLK from clock circuitry 26. Values stored in registers 40 may be updated based on clock signal CLK (e.g., at the rising edge of clock signal CLK). Clock signal CLK may be produced having a clock frequency associated with a desired performance level of programmable logic regions 18.

In order to satisfy timing constraints associated with the clock frequency of clock signal CLK (e.g., by using register 40 of region 18B for register pipelining), output signals from register 40 of programmable logic region 18A that are destined for programmable logic region 18C may be routed through register 40 of intervening programmable logic region 18B. For example, to satisfy critical path delay constraints associated with the clock frequency of clock signal CLK, programmable interconnects may be configured to route signals from region 18A to region 18B and from region 18B to region 18C.

Input and output selection circuitry 36 of programmable logic region 18A may be configured to route output signals from logic region 34 of programmable logic region 18A to programmable logic region 18B. Selection bypass paths 38 of programmable logic region 18B may be used to circumvent input and output selection circuitry 36 of region 18B. Bypass paths 38 may be used to route the signals from region 18A directly to register 40 of region 18B (e.g., bypassing input and output selection circuitry 36 of programmable logic region 18B). By bypassing input and output selection circuitry 36 of programmable logic region 18B, signal delay between registers 40 of regions 18A and 18B may be reduced.

Figure 4:
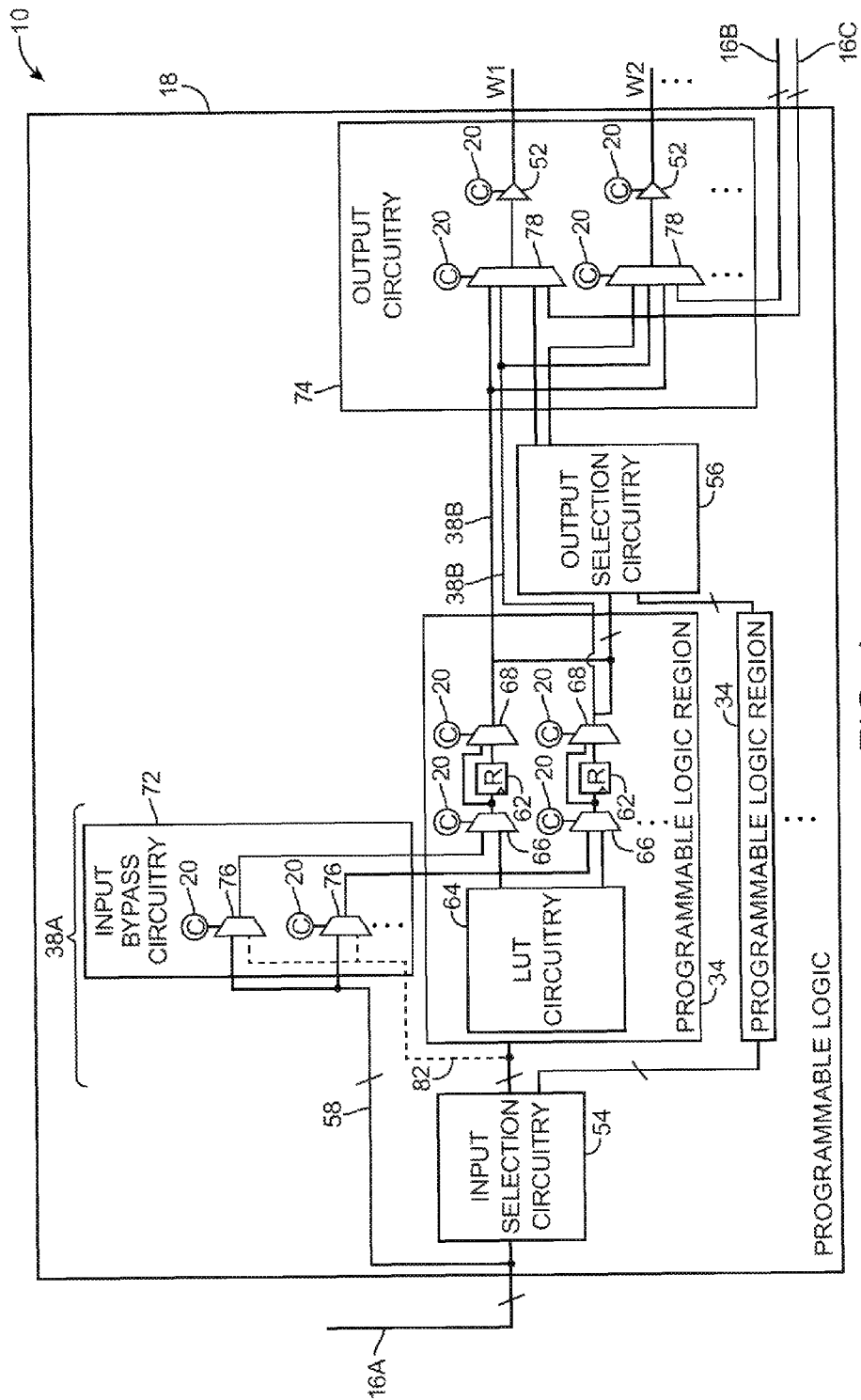
FIG. 4 is an illustrative diagram of programmable logic with input selection bypass paths and output selection bypass paths in accordance with an embodiment of the present invention.

A programmable logic region 18 having selection bypass paths 38A and 38B is shown in FIG. 4. Programmable logic region 18 may include input selection circuitry 54 and output selection circuitry 56. Programmable logic region 18 may include inputs coupled to interconnects 16A and outputs coupled to interconnects W1 and W2. Interconnects 16A, W1, and W2 may serve as global interconnects. The outputs may be driven with output signals from programmable logic region 18 using output circuitry 74. Interconnects W1 and W2 may be included in interconnects 16A. For example, output circuitry 74 may be used to drive interconnect W1 with output signals from programmable logic regions 34 while electrically disconnecting interconnect W2 from the outputs of programmable logic region 18. In this scenario, interconnect W2 may be used to route signals to an input of programmable logic region 18.

Output circuitry 74 may include multiplexers 78 and drivers 52. Each multiplexer 78 may have a corresponding driver 52 that drives an interconnect with a signal selected by that multiplexer 78. Each multiplexer 78 may have inputs coupled to output selection circuitry 56, additional interconnects (e.g., interconnects 16B or 16C), and registers 62 via bypass paths 38B. Interconnects 16B and 16C may be global interconnects such as interconnects 22, 23, 24, or 25 of FIG. 2 (e.g., interconnects for routing signals globally throughout device 10). Multiplexers 78 may each select a signal from register output signals on bypass paths 38B, the output signals of output selection circuitry 56, and signals on the additional interconnects. The selected signal may be driven onto a corresponding interconnect via a driver 52. If desired, drivers 52 may be configured via programmable elements 20 to electrically disconnect some or all of the interconnects that are coupled to drivers 52.

Additional interconnects 16B and 16C that are coupled to multiplexers 78 may include any desired interconnects. Interconnects 16B and 16C may include some or all of interconnects 16A, or may include additional interconnects (e.g., additional interconnects of different types or to different locations on integrated circuit 10). Multiplexers 78 may, for example, be configured to route signals from interconnects 16B or 16C to interconnects W1 and/or W2.

The example of FIG. 4 in which programmable logic region 18 is coupled to interconnects 16A, W1, and W2 is merely illustrative. If desired, programmable logic region 18 may be coupled to any desired number of interconnects that may be used for routing input signals to programmable logic region 18 and for routing output signals away from programmable logic region 18. For example, programmable logic region 18 may be coupled to interconnects formed along different axes and having different lengths. Programmable logic region may be coupled to tens or hundreds of interconnects (as an example).

Input selection circuitry 54 and output selection circuitry 56 may, if desired, be formed as portions of input and output selection circuitry 36 of FIG. 3. Input selection circuitry 54 may be coupled to interconnects 16A. Input selection circuitry 54 may receive signals from interconnects 16A and select input signals for programmable logic region 18 from the received signals. For example, input selection circuitry 54 may select a subset of the received signals from interconnects 16A and provide the selected subset of signals to programmable logic regions 34.

Programmable logic regions 34 may receive the selected input signals from input selection circuitry 54 and process the selected input signals to perform custom user functions. Programmable logic regions 34 may produce output signals that are provided to output selection circuitry 56. The output signals may be produced by look-up table (LUT) circuitry 64 and may be stored in registers 62. For example, look-up table circuitry 64 may include one or more look-up tables configured to process the input signals selected by input selection circuitry 54 to produce output signals that can be stored in registers 62 or provided directly as outputs of programmable logic region 34 via multiplexers 68.

As an example, multiplexers 68 may receive static control signals from programmable elements 20. In this scenario, appropriate control signal values may be stored in programmable elements 20 to configure multiplexers 68 to route either the stored output signals from register 62 or the output signals from multiplexers 66 to the outputs of programmable logic region 34. The example of FIG. 4 in which programmable logic regions 34 are provided with multiplexers 68 is merely illustrative. If desired, multiplexers 68 may be omitted and the outputs of registers 62 may be coupled directly to the outputs of programmable logic regions 34.

Output selection circuitry 56 may receive each of the output signals of programmable logic regions 34 at corresponding inputs. Output selection circuitry 56 may include multiplexers, tristate circuitry, or other selection circuitry that can be configured to route selected output signals from regions 34 to output circuitry 74. For example, the multiplexers may be configured to route an output signal from a programmable logic region 34 to multiplexer 78 that is coupled to interconnect W1.

Programmable logic region 18 may include selection bypass paths 38A and 38B that provide direct access to registers 62 (e.g., registers 62 of smaller programmable logic regions 34 within region 18). Selection bypass path 38A may serve as an input bypass path for bypassing input selection circuitry 54 and look-up table circuitry 64. Selection bypass paths 38B may serve as output bypass paths for bypassing output selection circuitry 56.

Input bypass paths 38A may include paths 58, input bypass circuitry 72, and multiplexers 66. Input bypass circuitry 72 may be coupled to a portion of interconnects 16A via paths 58. For example, paths 58 may couple a subset of interconnects 16A to inputs of circuitry 72. The portion of interconnects 16A that are coupled to input bypass circuitry 72 may be selected so that input bypass circuitry 72 is coupled to a sufficient number of different types of interconnects 16A.

As an example, interconnects 16A may include horizontal interconnects, vertical interconnects, and interconnects of various lengths (e.g., interconnects 22 of length H1, interconnects 23 of length H2, etc. as shown in FIG. 2). In this scenario, one of each type of interconnect may be coupled to input bypass circuitry 72 via paths 58 (e.g., a horizontal interconnect of length H1, a vertical interconnect of length V1, a horizontal interconnect of length H2, a vertical interconnect of length V2, etc.). This example is merely illustrative. If desired, any desired portion of interconnects 16A may be coupled to input bypass circuitry 72 via paths 58 (e.g., the portion may include two, four, six, or more of interconnects 16A).

Input bypass path 38A may include multiplexers 76 and 66. Input signals on interconnects that are coupled to paths 58 may be provided to multiplexers 76. Multiplexers 76 and 66 may be configured to route selected input signals from interconnects 16A directly to registers 62. For example, a given multiplexer 76 may be configured using a corresponding programmable element 20 to route a selected one of the input signals provided by paths 58 to an input of a corresponding multiplexer 66. In this scenario, the corresponding multiplexer 66 may be configured (e.g., via an associated programmable element 20) to route the selected input signal to a corresponding register 62 (e.g., instead of an output signal produced by look-up table circuitry 64).

Multiplexers 78 of output circuitry 74 may form part of output bypass path 38B between register 62 and interconnects W1 and W2. Multiplexers 78 may have inputs coupled directly to registers 62 and inputs coupled to output selection circuitry 56. Multiplexers 78 may be configured via corresponding programmable elements 20 to route selected signals from registers 62 and output selection circuitry 56 to interconnects W1 and W2 via interconnect drivers 52.

By providing direct access to registers 62 for a portion of interconnects 16A, input bypass paths 38A may help to reduce latency associated with pipelining signals while maintaining configuration flexibility of programmable logic regions 34. For example, input signals from a selected portion of interconnects 16A are no longer required to traverse input selection circuitry 54 in order to reach registers 62. In addition, the outputs of input selection circuitry 54 may be available for use in additional custom user functions. Consider the scenario in which input selection circuitry 54 is capable of routing six input signals from interconnects 16A to programmable logic regions 34. In this scenario, input bypass circuitry 72 may be used to route seventh and eighth input signals from interconnects 16A to registers 62 (e.g., seventh and eighth input signals from a subset of interconnects 16A that are coupled to input bypass circuitry 72 via local paths 58).

If desired, one or more of the input signals selected by input selection circuitry 54 may be provided to multiplexers 76 of input bypass circuitry 72 via optional paths 82. Optional paths 82 provide additional flexibility when selecting which of interconnects 16A are used to provide input signals to input bypass circuitry 72. For example, signals on interconnects that are not coupled to paths 58 may be selected using input selection circuitry 54 and provided to input bypass circuitry 72 in parallel with look-up tables 64 of programmable logic regions 34.

The example of FIG. 4 in which bypass paths are provided for registers 62 of a programmable logic region 34 within a larger region 18 is merely illustrative. If desired, bypass paths may be provided to any desired portion of registers in a programmable logic region 18. As an example, input and output selection bypass paths may be provided for registers 62 of multiple programmable logic regions 34 (e.g., input bypass circuitry 72 may provide input signals selected from a subset of the input signals provided by interconnects 16A to registers 62 of multiple programmable logic regions 34). As another example, selection bypass paths may be provided to only some of the registers in each programmable logic region 34. As yet another example, selection bypass paths may be provided to the registers in only some of programmable logic regions 34 (e.g., registers in a first programmable logic region 34 may be directly accessed via bypass paths whereas registers in a second programmable logic region 34 may only be accessed via input selection circuitry 54 and output selection circuitry 56).

Figure 5:
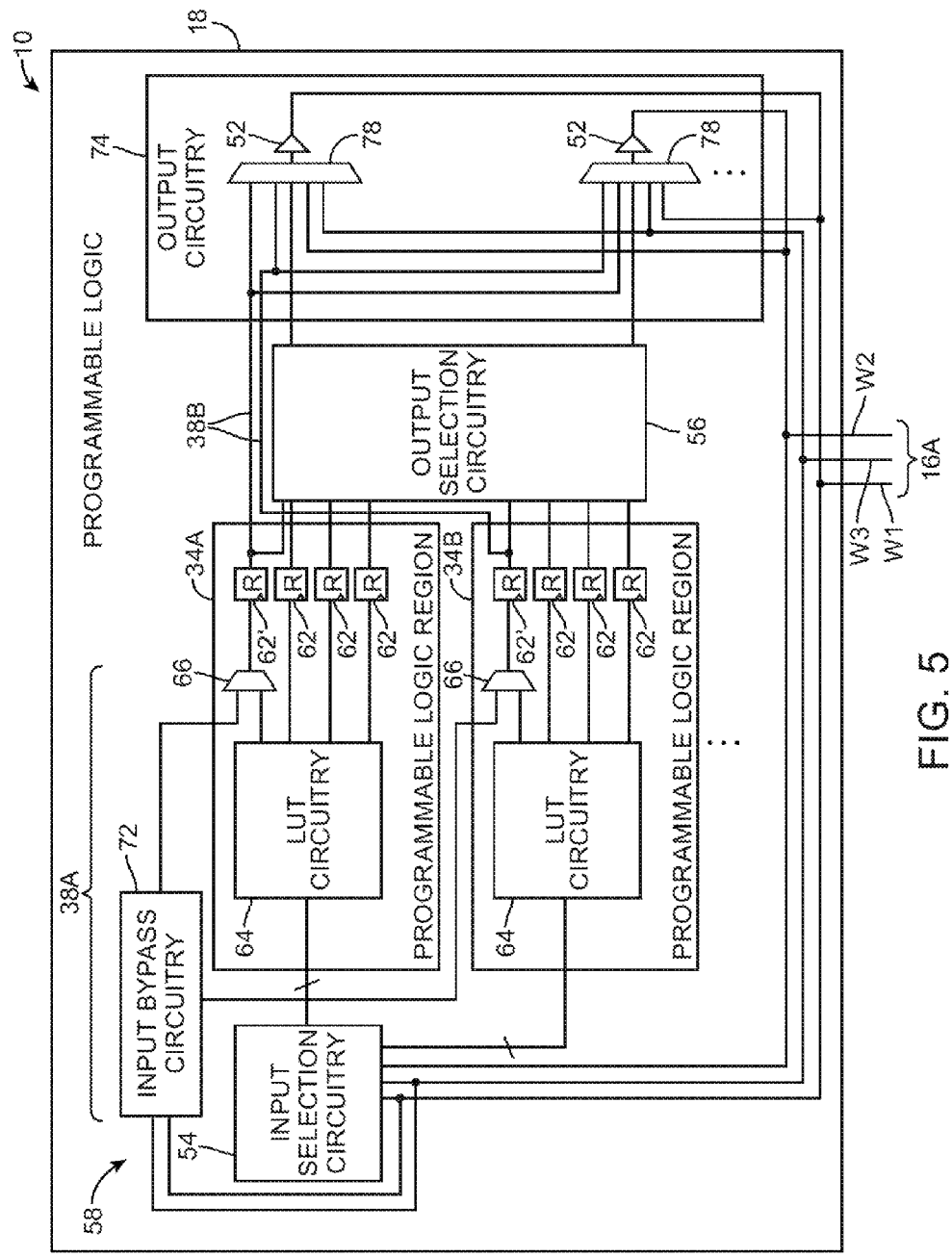
FIG. 5 is an illustrative diagram of programmable logic having registers and input and output selection bypass paths for a subset of the registers in accordance with an embodiment of the present invention.

An illustrative programmable logic region 18 having bypass paths for a subset of registers in region 18 is shown in FIG. 5. In the example of FIG. 5, programmable logic region 18 may include smaller programmable logic regions 34A and 34B. Regions 34A and 34B may each include registers 62 and 62'. Interconnects 16A may be coupled to programmable logic region 18.

Interconnects 16A may include interconnects W1, W2, and W3. Interconnects 16A may be coupled to input selection circuitry 54. Interconnects W1 and W3 (e.g., a subset of interconnects 16A) may be coupled to input bypass circuitry via paths 58. Selection bypass paths 38A may accommodate direct access to registers 62' from interconnects W1 and W3 via paths 58, input bypass circuitry 72, and multiplexers 66. Selection bypass paths 38B may accommodate direct access to interconnects W1 and W2 from the outputs of registers 62' via multiplexers 78 and drivers 52.

Consider the scenario in which register 62' of programmable logic region 34A is to be used for register pipelining of a signal on interconnect W1 (e.g., to satisfy critical path delay requirements associated with the frequency of a clock signal provided to registers such as register 62' that are used to store the signal). In this scenario, the signal on interconnect W1 may be received by input bypass circuitry 72 via paths 58. Input bypass circuitry 72 may be configured to route the signal to multiplexer 66 of programmable logic region 34A (e.g., via programmable elements 20 that control multiplexers such as multiplexers 76 in circuitry 72). Multiplexer 66 of region 34A may be configured to route the signal to a corresponding register 62'. The output of register 62' may be updated with the value of the signal (e.g., every clock cycle of a corresponding clock signal such as signal CLK of FIG. 3 that is provided to registers of programmable logic regions). The signal may be provided to multiplexers 78 from register 62' via output selection bypass paths 38B. Multiplexers 78 and drivers 52 may be configured to drive a desired interconnect with the signal.

The example of FIG. 5 in which interconnects 16A include interconnects W1, W2, and W3 is merely illustrative. Interconnects 16A may include any desired number of interconnects. For example, interconnects 16A may include tens or hundreds of interconnects or more. Interconnects 16A may include interconnects of different types (e.g., different lengths, routing directions, etc.). If desired, programmable logic region 18 may include a multiplexer 78 and a driver 52 for each of interconnects 16A. Alternatively, only a portion of interconnects 16A may be coupled to the outputs of multiplexers 78 and drivers 52.

Figure 6:
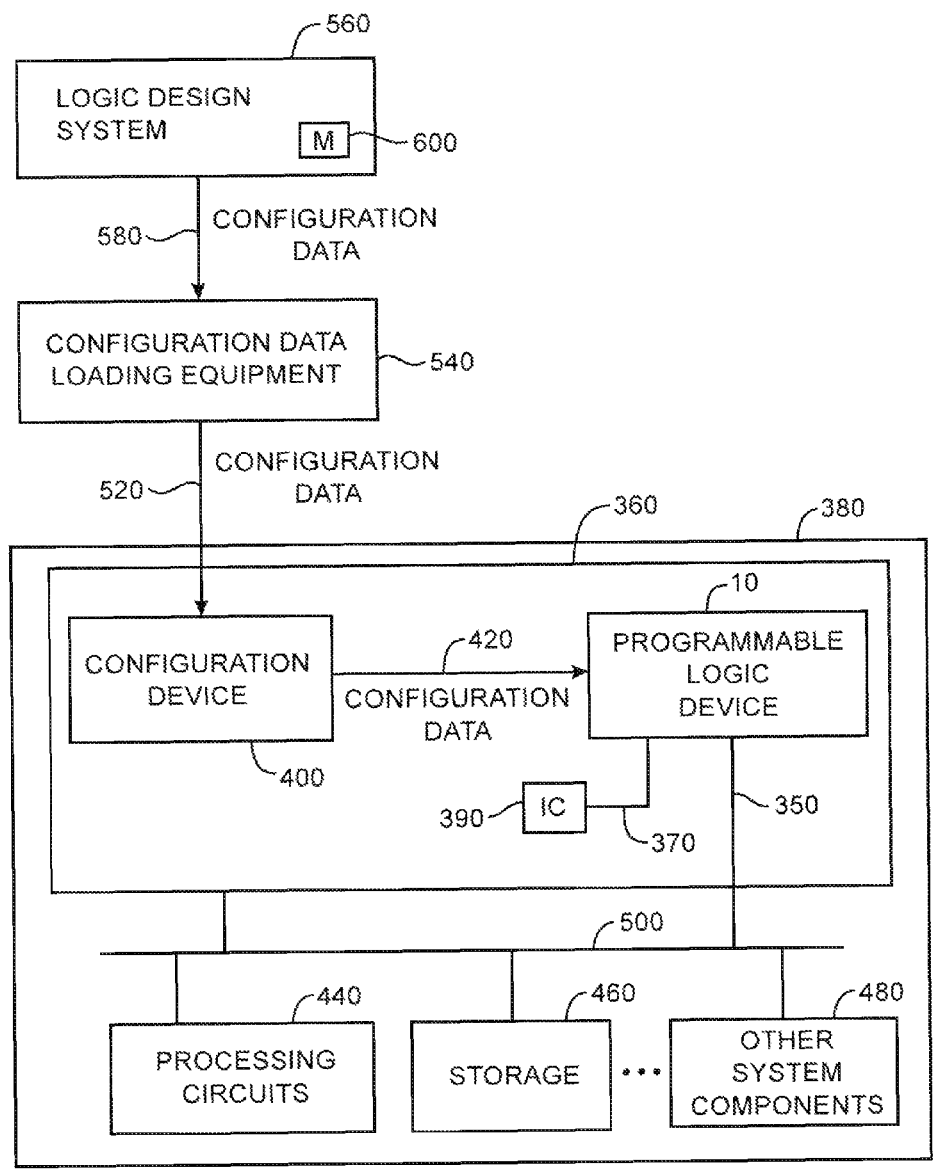
FIG. 6 is a diagram of an illustrative system environment in which a programmable integrated circuit may be configured using a logic design system in accordance with an embodiment of the present invention.

An illustrative system environment for integrated circuits such as programmable integrated circuits is shown in FIG. 6. Device 10 may be mounted on a board 360 in a system 380. Device 10 may receive configuration data from programming equipment or from any other suitable equipment or device.

In the example of FIG. 6, device 10 is a type of programmable integrated circuit that receives configuration data from an associated integrated circuit 400. With this type of arrangement, circuit 400 may, if desired, be mounted on the same board 36 as device 10. Circuit 400 may be a programmable logic device configuration data loading chip that loads configuration data into programmable logic device memory from an external electrically erasable-programmable read-only memory (EEPROM) chip, a programmable logic device configuration data loading chip with built-in memory (sometimes referred to as a configuration device), or any other suitable device. When system 380 boots up (or at another suitable time), the configuration data may be supplied to device 10 from device 400, as shown schematically by path 420. The configuration data that is supplied to device 10 may be stored in its programmable elements 20 (e.g., configuration random-access-memory elements).

System 380 may include processing circuits 440, storage 460, and other system components 480 that communicate with device 10. The components of system 380 may be located on one or more boards such as board 360 or other suitable mounting structures or housings.

Communication paths may be used to interconnect device 10 to other components. For example, communication path 370 may be used to convey data between an integrated circuit 390 that is mounted on board 360 and device 10. Communication paths 350 and 500 can be used to convey signals between device 10 and components 440, 460, and 480.

Configuration device 400 may be supplied with the configuration data for device 10 over a path such as path 520. Configuration device 400 may, for example, receive the configuration data from configuration data loading equipment 540 or other suitable equipment that stores the configuration data in configuration device 400. Device 400 may be loaded with data before or after installation on board 360.

It can be a significant undertaking to design and implement a desired logic circuit in a programmable logic device. Logic designers therefore generally use logic design systems based on computer-aided-design (CAD) tools to assist them in designing circuits. A logic design system (sometimes referred to as a circuit design system) can help a logic designer design and test complex circuits for a system. When a design is complete, the logic design system may be used to generate configuration data for electrically programming the appropriate programmable logic device. The logic design system may be implemented on computing equipment.

As shown in FIG. 6, the configuration data produced by a logic design system 560 may be provided to equipment 540 over a path such as path 580. Equipment 540 provides the configuration data to device 400 so that device 400 can later provide this configuration data to device 10 over path 420. System 560 may be based on one or more computers and one or more software programs. In general, software and data may be stored on any computer-readable medium (storage) in system 560 and is shown schematically as storage 600.

In a typical scenario, logic design system 560 is used by a logic designer to create a custom circuit design. The system 560 produces corresponding configuration data which is provided to configuration device 400. Upon power-up, configuration device 400 and data loading circuitry on device 10 is used to load the configuration data into the programmable memory elements 20 of device 10. Device 10 may then be used in normal operation of system 380.

Figure 7:
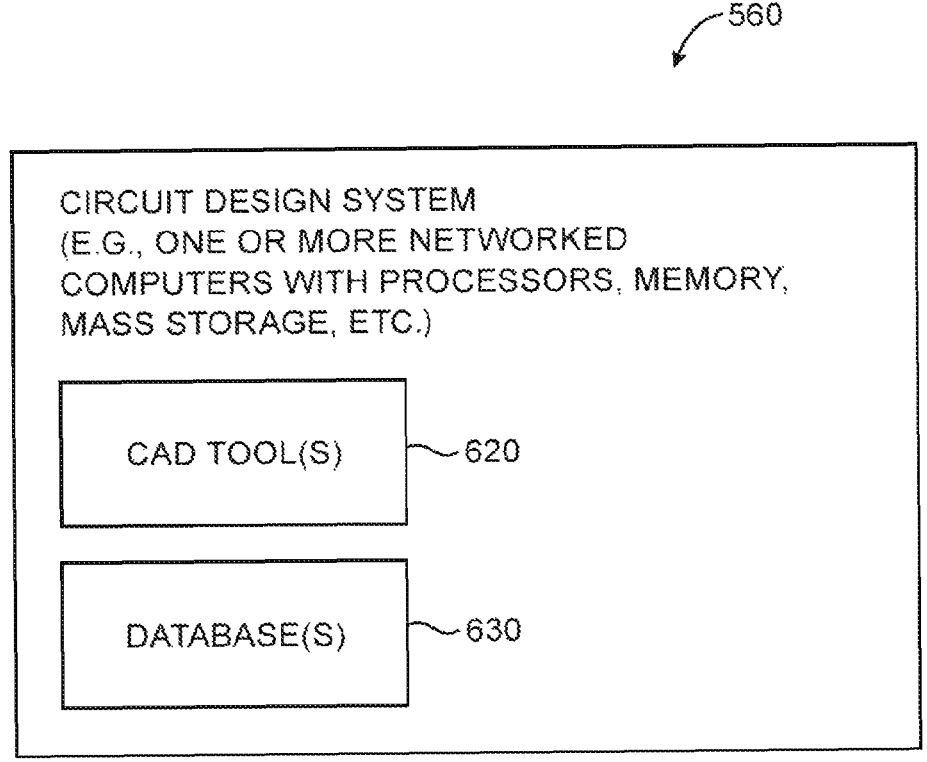
FIG. 7 is a diagram of a logic design system for generating configuration data for implementing custom circuit designs in programmable logic devices in accordance with an embodiment of the present invention.

An illustrative logic design system 560 in accordance with the present invention is shown in FIG. 7. System 560 may be based on one or more processors such as personal computers, workstations, etc. The processor(s) may be linked using a network (e.g., a local or wide area network). Memory in these computers or external memory and storage devices such as internal and/or external hard disks may be used to store instructions and data.

Software-based components such as computer-aided design tools 620 and databases 630 reside on system 560. During operation, executable software such as the software of computer aided design tools 620 runs on the processor(s) of system 560. Databases 630 are used to store data for the operation of system 560. In general, software and data may be stored on any computer-readable medium (storage) in system 560. Such storage, which is shown schematically as storage 600 of FIG. 6, may include computer memory chips, removable and fixed media such as hard disk drives, flash memory, compact discs (CDs), DVDs, other optical media, and floppy diskettes, tapes, or any other suitable memory or storage device(s). When the software of system 560 is installed, the storage 600 of system 560 has instructions and data that cause the computing equipment in system 560 to execute various methods (processes). When performing these processes, the computing equipment is configured to implement the functions of the logic design system.

The computer aided design (CAD) tools 620, some or all of which are sometimes referred to collectively as a CAD tool, may be provided by a single vendor or multiple vendors. Tools 620 may be provided as one or more suites of tools (e.g., a compiler suite for performing tasks associated with implementing a circuit design in a programmable logic device) and/or as one or more separate software components (tools). Database(s) 630 may include one or more databases that are accessed only by a particular tool or tools and may include one or more shared databases. Shared databases may be accessed by multiple tools. For example, a first tool may store data for a second tool in a shared database. The second tool can access the shared database to retrieve the data stored by the first tool. This allows one tool to pass information to another tool. Tools may also pass information between each other without storing information in a shared database if desired.

Figure 8:
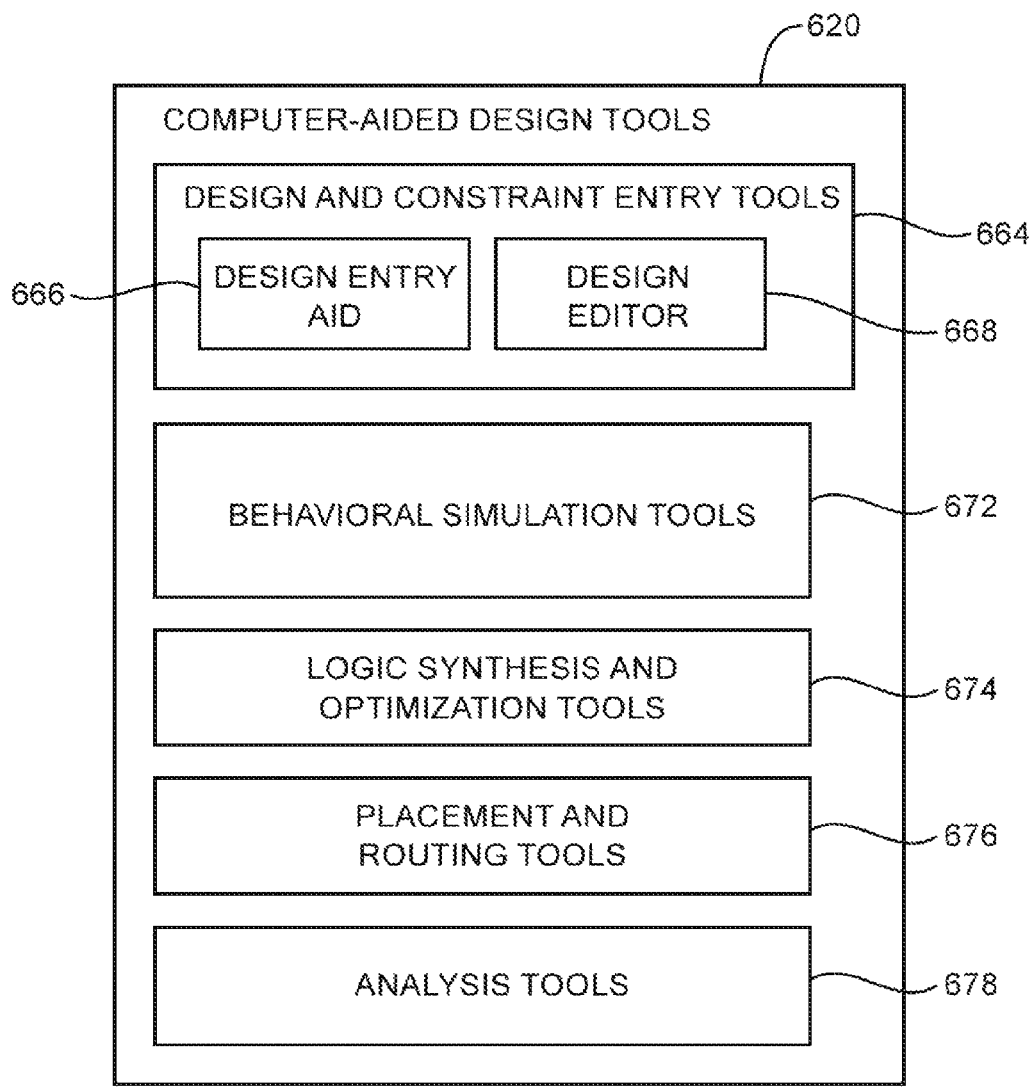
FIG. 8 is a diagram of illustrative computer-aided design (CAD) tools that may be used in a logic design system in accordance with an embodiment of the present invention.

Illustrative computer aided design tools 620 that may be used in a logic design system such as system 560 of FIGS. 6 and 7 are shown in FIG. 8.

The design process typically starts with the formulation of logic circuit functional specifications (e.g., a functional description of the logic circuit). A logic designer can specify how a desired circuit should function using design and constraint entry tools 664. Design and constraint entry tools 664 may include tools such as design and constraint entry aid 666 and design editor 668. Design and constraint entry aids such as aid 666 may be used to help a logic designer locate a desired design from a library of existing logic designs and may provide computer-aided assistance to the logic designer for entering (specifying) the desired design.

As an example, design and constraint entry aid 666 may be used to present screens of options for a user. The user may click on on-screen options to select whether the circuit being designed should have certain features. Design editor 668 may be used to enter a design (e.g., by entering lines of hardware description language code), may be used to edit a design obtained from a library (e.g., using a design and constraint entry aid), or may assist a user in selecting and editing appropriate prepackaged code/designs.

Design and constraint entry tools 664 may be used to allow a logic designer to provide a desired logic design using any suitable format. For example, design and constraint entry tools 664 may include tools that allow the logic designer to enter a logic design using truth tables. Truth tables can be specified using text files or timing diagrams and may be imported from a library. Truth table logic design and constraint entry may be used for a portion of a large circuit or for an entire circuit.

As another example, design and constraint entry tools 664 may include a schematic capture tool. A schematic capture tool may allow the logic designer to visually construct logic circuits from constituent parts such as logic gates and groups of logic gates. Libraries of preexisting logic circuits may be used to allow a desired portion of a design to be imported with the schematic capture tools.

If desired, design and constraint entry tools 664 may allow the logic designer to provide a logic design to the logic design system 560 using a hardware description language such as Verilog hardware description language (HDL) or Very High Speed Integrated Circuit Hardware Description Language (VHDL). The designer of the logic circuit can enter the logic design by writing hardware description language code with editor 668. Blocks of code may be imported from user-maintained or commercial libraries if desired.

After the design has been entered using design and constraint entry tools 664, behavioral simulation tools 672 may be used to simulate the functional performance of the design. If the functional performance of the design is incomplete or incorrect, the logic designer can make changes to the design using design and constraint entry tools 664. The functional operation of the new design can be verified using behavioral simulation tools 672 before synthesis operations have been performed using tools 674. Simulation tools such as tools 672 may also be used at other stages in the design flow if desired (e.g., after logic synthesis). The output of the behavioral simulation tools 672 may be provided to the logic designer in any suitable format (e.g., truth tables, timing diagrams, etc.).

Once the functional operation of the logic design has been determined to be satisfactory, logic synthesis and optimization tools 674 may be used to implement the logic design in a particular programmable logic device (i.e., in the logic and interconnect resources of a particular programmable logic device product or product family).

Tools 674 attempt to optimize the design by making appropriate selections of hardware to implement different logic functions in the logic design based on the logic design data and constraint data entered by the logic designer using tools 664.

After logic synthesis and optimization using tools 674, the logic design system may use tools such as placement and routing tools 676 to perform physical design steps (layout synthesis operations). Placement and routing tools 676 are used to determine how to place the circuits for each logic function within the programmable logic device. For example, if two counters interact with each other, the placement and routing tools 676 may locate these counters in adjacent logic regions on the programmable logic device to reduce interconnect delays or to satisfy timing requirements specifying the maximum permitted interconnect delay. The placement and routing tools 676 create orderly and efficient implementations of logic designs for a given programmable logic device.

Tools such as tools 674 and 676 may be part of a compiler suite (e.g., part of a suite of compiler tools provided by a programmable logic device vendor). In accordance with the present invention, tools such as tools 674, 676, and 678 automatically take into account the effects of crosstalk between interconnects while implementing a desired circuit design. Tools 674, 676, and 678 may also include timing analysis tools such as timing estimators. This allows tools 674 and 676 to satisfy performance requirements (e.g., timing requirements) when generating configuration data for programming integrated circuits such as programmable integrated circuit 10.

After an implementation of the desired logic design in the programmable logic device has been generated using placement and routing tools 676, the implementation of the design may be analyzed and tested using analysis tools 678. After satisfactory optimization operations have been completed using tools 620, tools 620 can produce the configuration data for the programmable logic device.

Figure 9:
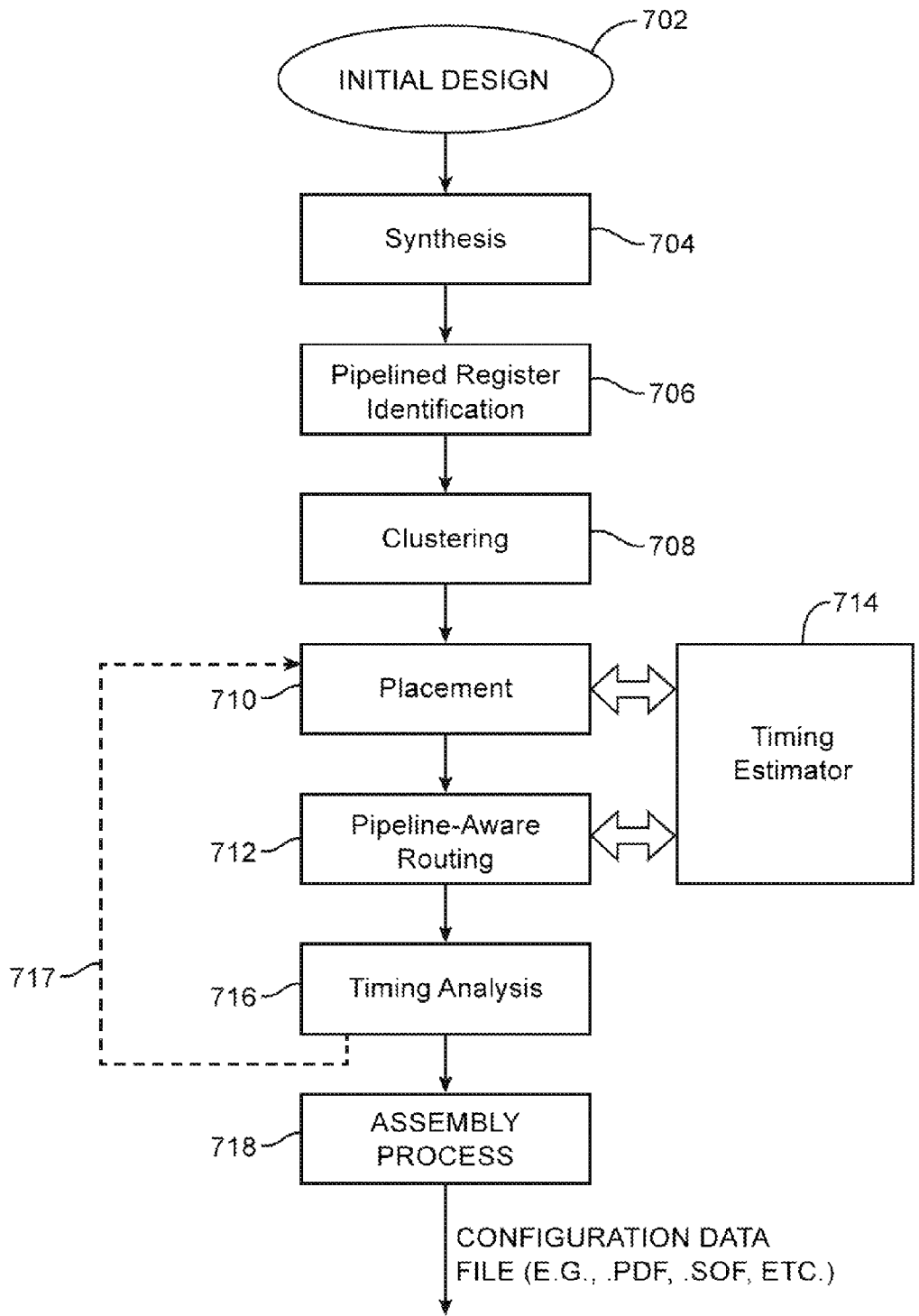
FIG. 9 is a flow chart of illustrative steps for designing a custom logic circuit and producing configuration data for the custom logic circuit in accordance with an embodiment of the present invention.

Illustrative operations involved in using tools 620 of FIG. 8 to produce configuration data files are shown in FIG. 9. As shown in FIG. 9, an initial design 702 may be provided (e.g., by a user) for synthesis during step 704. The initial design may include a description of hardware (e.g., using a hardware description language or other forms of describing circuit functions). During step 704, the hardware description of the initial design may be synthesized into a netlist by mapping the hardware description to hardware resources. For example, the custom functions described in the initial design may be mapped to look-up table circuitry and registers in the synthesized netlist.

The custom functions described in the synthesized netlist may include registers that are used for register pipelining (e.g., to accommodate critical path delay requirements). During the operations of step 706, logic design system 560 may analyze the synthesized netlist and/or the initial hardware description to identify registers that are to be used for register pipelining. For example, the synthesized netlist may include descriptions provided by a user that identify which registers are used for register pipelining. The descriptions may include macros or other key words that identify registers used for register pipelining (e.g., registers that are associated with pipelining). As an example, the registers may be tagged by the user with appropriate key words such as "pipeline register" or "pipeline_reg". The registers may be tagged through the use of synthesis attributes or pragmas (e.g., tags that are associated with synthesizing a netlist).

If desired, the synthesized netlist and initial hardware description may be analyzed using one or more rules that may be matched against registers in the synthesized netlist. As an example, a rule may be defined that matches registers that are coupled in series by interconnects (e.g., the rule may identify series of interconnected registers). If desired, the rule may exclude registers that are known to be shift registers or other types of registers that are not used for register pipelining. As another example, a rule may be defined that matches registers that receive the same clock signal. Logic design system 560 may use the rule to identify registers 40 of FIG. 3 that are each controlled by clock signal CLK.

During the operations of step 708, logic design system 560 may perform clustering to organize the synthesized netlist into a structure suitable for implementation using programmable logic regions such as programmable logic regions 18 and smaller programmable logic regions 34. For example, look-up table circuits and registers may be grouped to form clusters for more efficient mapping to programmable logic regions 18 (e.g., the groups may be determined based on the available resources of each programmable logic region).

Registers in the synthesized netlist that have been identified as being used for register pipelining (e.g., during step 706) may be excluded from the clustering process of step 708. In other words, the excluded registers may not be included in any of the groups formed during step 708. The registers may be excluded by removing the registers from the synthesized netlist and marking the locations of each of the removed registers in the synthesized netlist.

During the operations of step 710, logic design system 560 may perform a placement process in which the locations of the groups (clusters) of circuitry are determined (e.g., which programmable logic regions are configured as the groups of circuitry). For example, each group of circuitry may be assigned to a corresponding programmable logic region 18 on integrated circuit 10. The placement process of step 710 may be performed to map custom user functions from the synthesized netlist to logic regions on a programmable integrated circuit while excluding registers that are associated with pipelining (e.g., registers that have been identified as being intended for pipelining).

Logic design system 560 may include a timing estimator 714 (e.g., formed as part of optimization tools 674, tools 676, or tools 678) that may be used to estimate routing delays between signal sources and corresponding signal destinations. For example, timing estimator 714 may be used to estimate routing delays between programmable logic regions 34 (e.g., based on the lengths of interconnects, multiplexing delays, etc.). The routing delays may, if desired, be estimated based on metrics such as slack (e.g., the difference between a required arrival time and the arrival time of a signal), slack-ratios, interconnect congestion, or other timing metrics. Logic design system 560 may use the estimated routing delays to determine the locations of groups of circuitry while helping to ensure that routing delays satisfy timing requirements (e.g., critical path delay requirements) or other performance constraints.

Timing estimator 714 may be configured to produce estimated delays that include adjustments for register pipelining. For example, routing paths that include register pipelining may be assigned a lower estimated delay value in comparison with routing paths that do not include register pipelining. The estimated delay values for a given routing path may be determined based on the number of registers used for register pipelining in the routing path (e.g., the estimated delay value may be calculated by dividing a delay value estimated for the routing path without register pipelining by the number of registers used for register pipelining).

During the operations of step 712, logic design system 560 may determine which interconnects are used to form routing paths between signal sources and signal destinations and determine which registers are used for register pipelining. Logic design system 560 may map identified registers that are associated with register pipelining to logic regions of a programmable integrated circuit (e.g., to registers of the logic regions that can be accessed via corresponding bypass paths). Logic design system 560 may determine which registers are used for register pipelining based on the placement results of step 710. A final netlist may be produced by logic design system 560 using the results of steps 710 and 712.

As an example, during step 710, registers of programmable logic regions 18 may be used for custom functions described in initial design 702 and a corresponding synthesized netlist. In this scenario, logic design system 560 may identify which registers are still available for use (e.g., registers that have not been reserved for custom user functions). Logic design system 560 may identify interconnect paths between signal sources and signal destinations that require register pipelining (e.g., based on information stored in the synthesized netlist during step 706). Registers used for register pipelining may be selected from available registers that are located near the identified interconnect paths. For example, logic design system 560 may configure register 62' of programmable logic region 34B of FIG. 5 for register pipelining by routing a signal through register 62' using input bypass path 38A and output bypass path 38B.

During the operations of step 716, logic design system 560 may perform a timing analysis on the final netlist. The timing analysis may be used to help ensure that the final netlist satisfies timing constraints before configuring a programmable integrated circuit. If desired, the process may return to step 710 via optional path 717 to perform optimizations using the final netlist. For example, logic design system 560 may identify routing paths in the final netlist that fail timing constraints and determine replacement routing paths by returning to step 710 via optional path 717.

In step 718, the final netlist may be processed further during an assembly process to produce a configuration data file output (e.g., a .pof or .sof file). The configuration data file output may then be loaded onto a programmable integrated circuit.

If desired, logic design system 560 may be configured to identify routing paths that should be configured to include register pipelining (e.g., during the operations of step 706). For example, logic design system 560 may identify signal sources and corresponding signal destinations and estimate the routing delay required for signals to traverse interconnects between the signal sources and signal destinations. In this scenario, logic design system 560 may identify clock signals associated with the signal sources (e.g., source registers) and signal destinations (e.g., destination registers). The identified clock signals and estimated routing delays may be used to determine whether register pipelining should be configured between each signal source and corresponding signal destination.

The foregoing is merely illustrative of the principles of this invention and various modifications can be made by those skilled in the art without departing from the scope and spirit of the invention. The foregoing embodiments may be implemented individually or in any combination.

What is claimed is:

1. An integrated circuit comprising:
   a logic region having a plurality of inputs and a register;
   a plurality of interconnects that route signals throughout the integrated circuit;
   input selection circuitry that provides selected signals from the plurality of interconnects to the inputs of the logic region;
   look-up table circuitry that receives the selected signals from the input selection circuitry and processes the selected signals to produce output signals; and
   bypass circuitry coupled between the plurality of interconnects and the register, wherein the bypass circuitry bypasses the input selection circuitry and the look-up table circuitry.

2. The integrated circuit defined in claim 1 wherein the bypass circuitry is coupled to a subset of the plurality of interconnects and wherein the bypass circuitry is bypasses the input selection circuitry by routing a signal from a selected interconnect of the subset to the register.

3. The integrated circuit defined in claim 1 wherein the logic region further comprises:
   a multiplexer that receives one of the output signals from the look-up table circuitry and the signal from the selected interconnect of the subset and routes a selected one of the received signals to the register.

4. The integrated circuit defined in claim 3 wherein the input bypass circuitry comprises:
   an additional multiplexer coupled to the subset of the plurality of interconnects, wherein the additional multiplexer routes the signal from the selected interconnect of the subset to the register through the multiplexer.

5. The integrated circuit defined in claim 1 wherein the logic region processes the selected signals provided by the input selection circuitry to produce logic region output signals.

6. The integrated circuit defined in claim 5 further comprising:
   an additional interconnect; and
   output selection circuitry that receives the logic region output signals and provides a selected one of the logic region output signals to the additional interconnect.

7. The integrated circuit defined in claim 6 further comprising:
   a bypass path coupled to the register and the additional interconnect, wherein the bypass path bypasses the output selection circuitry by providing a register output signal to the additional interconnect.

8. The integrated circuit defined in claim 7 further comprising:

a multiplexer that receives the register output signal and the selected one of the logic region output signals from the output selection circuitry and provides a multiplexer output signal selected from the register output signal and the selected one of the logic region output signals to the additional interconnect.

9. The integrated circuit defined in claim 8 further comprising:
a driver circuit that receives the multiplexer output signal and drives the additional interconnect with the multiplexer output signal.

10. The integrated circuit defined in claim 8 wherein the multiplexer receives at least some of the signals from the plurality of interconnects and wherein the multiplexer output signal is selected from the register output signal, the selected one of the logic region output signals, and the at least some of the signals from the plurality of interconnects.

11. The integrated circuit defined in claim 1 wherein the integrated circuit comprises a programmable integrated circuit and wherein the logic region comprises a programmable logic region.

12. An integrated circuit, comprising:
a logic region including a plurality of registers operable to produce logic region output signals;
an interconnect;
output selection circuitry coupled to the interconnect, wherein the output selection circuitry receives each of the logic region output signals and routes a selected one of the logic region output signals to the interconnect; and
a bypass path that couples a given register of the plurality of registers to the interconnect and bypasses the output selection circuitry.

13. The integrated circuit defined in claim 12 further comprising:
output circuitry that receives the logic region output signal from the given register over the bypass path and the selected one of the logic region output signals from the output selection circuitry, wherein the output circuitry drives the interconnect with an interconnect signal selected from the logic region output signal and the selected one of the logic region output signals.

14. The integrated circuit defined in claim 13 wherein the output circuitry comprises:
a multiplexer having multiplexer inputs at which the logic region output signal from the given register and the selected one of the logic region output signals from the output selection circuitry are received, wherein the multiplexer provides the interconnect signal; and
a driver circuit that receives the interconnect signal from the multiplexer drives the interconnect with the interconnect signal.

15. The integrated circuit defined in claim 12 further comprising:
a plurality of additional interconnects;
input selection circuitry coupled to the plurality of additional interconnects, wherein the input selection circuitry receives signals from the plurality of additional interconnects and provides the logic region with logic region input signals selected from the received signals; and
input bypass circuitry that receives a subset of the signals from the plurality of additional interconnects and provides a register input signal selected from the received subset of the signals to the given register of the plurality of registers.

16. The integrated circuit defined in claim 15 wherein the input bypass circuitry comprises:
a multiplexer that receives the subset of the signals and provides the register input signal to the given register of the plurality of registers.

17. Circuitry, comprising:
an interconnect;
a first logic region having look-up table circuitry that generates signals and output selection circuitry that routes a selected one of the signals to the interconnect; and
a second logic region having look-up table circuitry, a register coupled to the look-up table circuitry, input selection circuitry coupled between the register and the interconnect, and an input bypass path that bypasses the input selection circuitry and routes the selected signal from the interconnect to the register.

18. The circuitry defined in claim 17 wherein the second logic region further comprises:
output selection circuitry coupled between the register of the second logic region and an additional interconnect; and
an output bypass path that bypasses the output selection circuitry of the second logic region and routes the selected signal from the register to the additional interconnect.

19. The circuitry defined in claim 18 wherein the input bypass path of the second logic region comprises a multiplexer having inputs that are coupled to the interconnect and to an output of input selection circuitry.

20. The circuitry defined in claim 18 wherein the circuitry comprises a programmable integrated circuit and wherein the multiplexer of the input bypass path is configured by a programmable element that is loaded with configuration data.

* * * * *